(12) United States Patent
Shum et al.

(10) Patent No.: US 7,777,520 B2
(45) Date of Patent: Aug. 17, 2010

(54) SYSTEM, METHOD AND APPARATUS FOR ENHANCING RELIABILITY ON SCAN-INITIALIZED LATCHES AFFECTING FUNCTIONALITY

(75) Inventors: Chung-Lung Kevin Shum, Wappingers Falls, NY (US); Scott B. Swaney, Germantown, NY (US)

(73) Assignee: International Business Machines Corporation, Armonk, NY (US)

( * ) Notice: Subject to any disclaimer, the term of this patent is extended or adjusted under 35 U.S.C. 154(b) by 357 days.

(21) Appl. No.: 12/031,730

(22) Filed: Feb. 15, 2008

(65) Prior Publication Data
US 2009/0206872 A1 Aug. 20, 2009

(51) Int. Cl.
*H03K 19/173* (2006.01)
(52) U.S. Cl. .......................... 326/46; 714/727
(58) Field of Classification Search ............... 326/16, 326/38, 46; 714/724–727
See application file for complete search history.

(56) References Cited

U.S. PATENT DOCUMENTS

| | | | |
|---|---|---|---|
| 5,307,142 A | 4/1994 | Corbett et al. | |
| 5,815,512 A * | 9/1998 | Osawa et al. | 714/726 |
| 6,327,176 B1 | 12/2001 | Li et al. | |
| 6,369,630 B1 | 4/2002 | Rockett | |
| 7,071,749 B2 | 7/2006 | Gardner | |
| 7,212,056 B1 | 5/2007 | Belov | |
| 2008/0091997 A1* | 4/2008 | Osanai | 714/727 |
| 2009/0210763 A1* | 8/2009 | Eckelman et al. | 714/731 |

OTHER PUBLICATIONS z/Architecture, Principles of Operation, Sixth Edition, Apr. 2007, Publication No. SA22-7832-05, copyright IBM Corp. 1990-2007, pp. 1-1218.

* cited by examiner

*Primary Examiner*—Don P Le
(74) *Attorney, Agent, or Firm*—Cantor Colburn LLP; John Campbell

(57) ABSTRACT

A system, method, and apparatus for enhancing reliability on scan-initialized latches that affect functionality in a digital design are provided. The system includes a group of latches that affect functionality in the digital design based on state values of the latches, where the latches are scan initialized. The system also includes a disable allowance latch (DAL) allocated to the group of latches, where the DAL is a scan-initialized latch. The system further includes a gating function outputting the state value of at least one of the latches in the group to a functional block in the digital design in response to the DAL being in an enabled state and blocking the gating function output in response to the DAL being in a disabled state.

20 Claims, 2 Drawing Sheets

SYSTEM, METHOD AND APPARATUS FOR ENHANCING RELIABILITY ON SCAN-INITIALIZED LATCHES AFFECTING FUNCTIONALITY

BACKGROUND OF THE INVENTION

This invention relates generally to enhancing reliability of a digital design, and more particularly to enhancing reliability on scan-initialized latches that affect functionality in a digital design.

As digital design, such as a microprocessor, becomes more complex, alternate modes of operation may be desirable to bypass complicated sequences. Therefore, these designs usually include scan-initialized latches, are commonly known as disable switches, chicken switches, back-off mode switches or simply mode latches. The mode latches act as switches, holding an assigned state value, to modify functionality within the designs by enabling or disabling circuitry with which they interface. The mode latches cannot change states using normal functional logic or circuits, but can be changed during system initialization through a process known as scanning. This is intended to provide a window of access to configure and test the design, and prevent potentially unintended or harmful changes of these mode latches from occurring after initialization. These mode latches default to a state such that the design behaves as planned for best performance and for providing maximum functionality. Configuring a design for best performance with maximum functionality can lead to complex windows, where the design becomes very bug prone.

When the mode latches are scanned into non-default (active) states, design performance can change, resulting in modified behavior. The affected design may respond by disabling a feature, removing some performance enhancements, working with reduced capacity, or simply running at some preset "slower" modes. During verification of actual hardware or its design model, certain design bugs can be encountered in complicated design windows. Sometimes developing an actual fix to the identified bugs can require a long turn-around time. The most important role of the latches is to provide an alternate functional behavior for temporarily workarounds. If a certain workaround switch is available by simply changing a mode latch's initial state, so to avoid the complex window that leads to a design bug, verification can progress until a final fix is available.

In a microprocessor or any complex design that provides best of breed error detection, various approaches may be devised to check for or prevent possible errors caused by single event upsets. A single event upset (SEU) is a change of state caused by a high-energy particle strike to a sensitive node in a micro-electronic device that may result from environmental effects, such as alpha particles. Although it is intended for scan-initialized latches to retain their values during normal operation, and numerous of circuit design techniques had been devised to harden these latches, SEUs can still result in the mode latches changing state unexpectedly. It would be beneficial to develop an approach to cover potential unintended activation of scan-initialized mode latches that can lead to unwanted modifications of the design functionality.

To detect if any of the mode latches have been activated unintentionally during normal operation, one approach is to include parity latch bits covering these latches. If any of the mode latches flip, a parity error is detected, and the design can be re-scanned. However, a reboot or system initialization, which is usually employed to re-scan the mode latches, is not a good option. This kind of interruption is not desirable for a processor running in a server that needs to provide seamless operation. On a processor that includes a hardware recovery scheme, a general state reset cannot restore the scan-initialized latches either. In turn, the recovery will fail, and in some high reliability systems, another processor may be used to pick up the current process being executed. Even though that solution may be acceptable, it is not generally available and is quite complex to implement.

It would be desirable to increase overall reliability of a digital design that uses scan-initialized latches that can affect functionality during normal operation. The solution should be simple to reduce cost and minimize the associated burden during normal operation. Accordingly, there is a need in the art for enhancing reliability on scan-initialized latches that affect functionality in a digital design.

BRIEF SUMMARY OF THE INVENTION

An exemplary embodiment includes a system for enhancing reliability on scan-initialized latches that affect functionality in a digital design. The system includes a group of latches that affect functionality in the digital design based on state values of the latches, where the latches are scan initialized. The system also includes a disable allowance latch (DAL) allocated to the group of latches, where the DAL is a scan-initialized latch. The system further includes a gating function outputting the state value of at least one of the latches in the group to a functional block in the digital design in response to the DAL being in an enabled state and blocking the gating function output in response to the DAL being in a disabled state.

Another exemplary embodiment includes a method for enhancing reliability on scan-initialized latches that affect functionality in a digital design. The method includes grouping latches with a DAL. The latches affect functionality in the digital design based on state values of the latches. The latches and the DAL are scan initialized. The method also includes outputting the state value of at least one of the latches in the group to a functional block in the digital design in response to the DAL being in an enabled state. The method further includes blocking output of the state value of the at least one of the latches in the group to the functional block in the digital design in response to the DAL being in a disabled state.

A further exemplary embodiment includes apparatus for enhancing reliability on scan-initialized latches that affect functionality in a digital design. The apparatus includes a group of disable latches in a functional macro of the digital design that affect functionality in the functional macro based on state values of the disable latches, where the disable latches are scan initialized. The apparatus also includes a DAL allocated to the group of disable latches, where the DAL is a scan-initialized latch. The apparatus further includes a gating function outputting the state value of at least one of the disable latches in the group to one or more functional blocks in the digital design in response to the DAL being in an enabled state and blocking the gating function output in response to the DAL being in a disabled state.

BRIEF DESCRIPTION OF THE DRAWINGS

Referring now to the drawings wherein like elements are numbered alike in the several FIGURES.

DETAILED DESCRIPTION OF EXEMPLARY EMBODIMENTS

An exemplary embodiment of the present invention enhances reliability on scan-initialized latches that affect functionality in a digital design. By including an additional scan-initialized latch with a group of existing scan-initiated latches, a high level of tolerance against unintended activation of the scan-initiated latches can be achieved. A scan-initiated latch that is only initiated to a non-default state value via scanning during initialization and prior to normal operation in a digital design, such as a processor. Operating modes corresponding to enabling the scan-initiated latches (also referred to as disable latches or disable switches) are typically not desired operating modes in the final version of a digital design while in normal operation, but are for special test and development purposes. Therefore, the disable latches are usually initiated or simply defaulted to "inactive" state values in the final design.

In an exemplary embodiment, a local scan-initiated latch, called a disable allowance latch (DAL), is allocated to a group of mode or disable latches that can affect functionality of the design if enabled. For example, the functionality can be a work around for debugging purposes, a function that enables a special test mode, or alters performance characteristics (e.g., a reduced speed). If the DAL is off/disabled, any of the disable latches in its corresponding group are blocked from affecting the design. If the DAL is on/enabled, then the disable latches can affect the design. There may be multiple groups of disable latches in the design, each with its own DAL. In other words, any scan-initiated latch can only affect the design if it is active together with its corresponding DAL. Since the final design typically has a very minimal number of disable latches active (e.g., near zero), this is an economical way of "hardening" the disable latches without too much additional cost or complexity. Scan-initiated latches are usually quite tolerant to single event upsets (SEUs), such as alpha particle hits. Using a second scan-initiated latch (i.e., a DAL) in combination with existing scan-initiated latches effectively reduces the possibility of unwanted activation of disable latches to a minimal possibility, as the state values of two latches must be flipped to active/enabled by SEUs. Thus, susceptibility to SEUs in scan-initialized latches that affect functionality in a digital design is reduced, which enhances overall reliability on the overall design.

Figure 1:
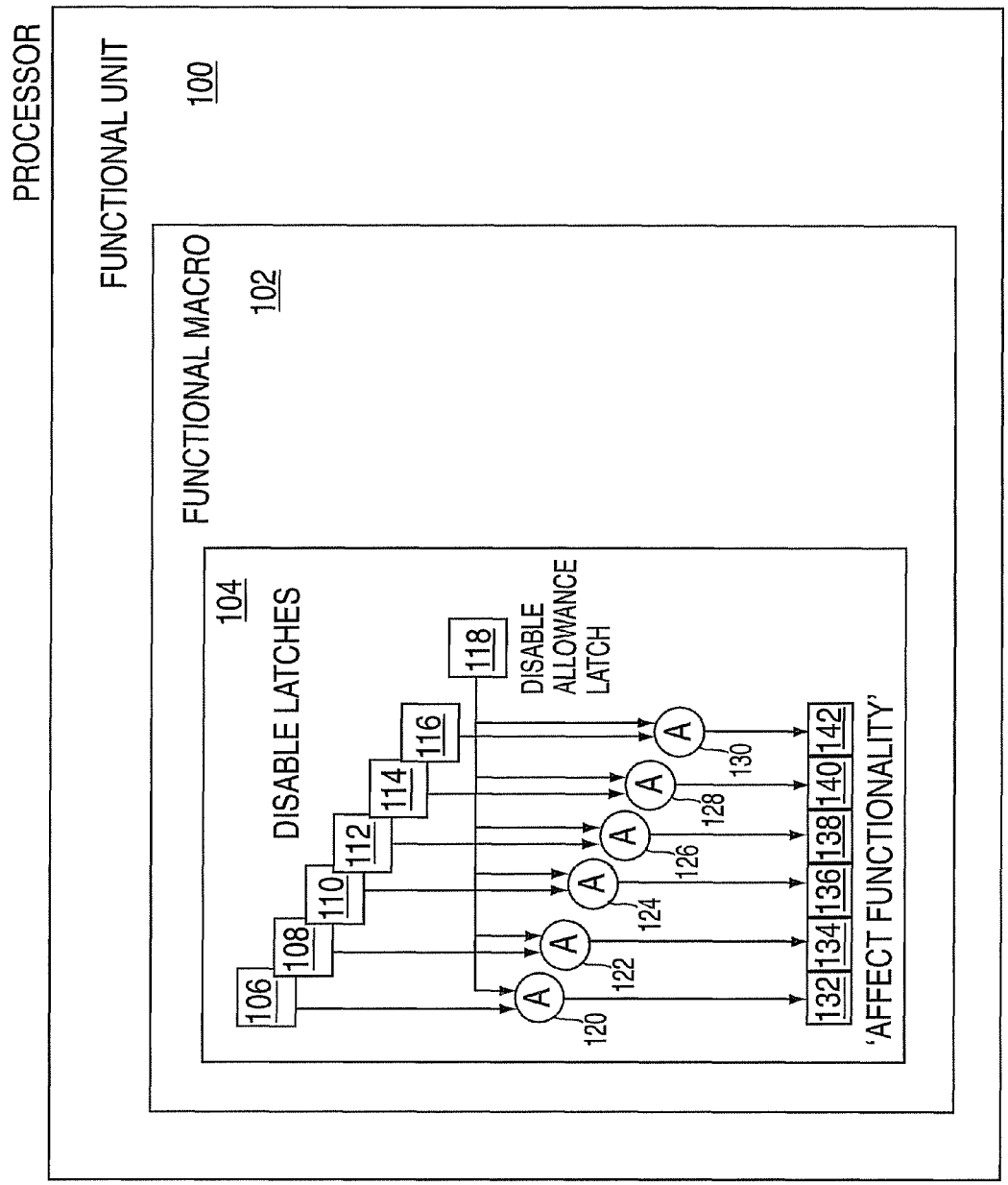
FIG. 1 depicts a block diagram of a processor in accordance with an exemplary embodiment.

Turning now to FIG. 1, a processor 100 is depicted that can include multiple functional units, such as functional unit 102 as part of a processing apparatus or system. The functional unit 102 may include multiple functional macros, such as functional macro 104. The functional macro 104 includes disable latches 106, 108, 110, 112, 114, and 116. A disable allowance latch (DAL) 118 is routed to gating functions 120, 122, 124, 126, 128, and 130 to enable or disable functionality in blocks 132, 134, 136, 138, 140, and 142. The gating functions 120-130 can be AND-gate functions, buffers (e.g., tri-state buffers), or other similar technologies known in the art that allow the DAL 118 to control whether the disable latches 106-116 are blocked from activating functionality in the blocks 132-142. Although described as "disable latches", the disable latches 106-116 may also represent mode latches that act as switches, holding an assigned state value, to modify functionality within the processor 100 by enabling or disabling circuitry with which they interface (e.g., in blocks 132-142).

In an exemplary embodiment, the DAL 118 acts as an enable/disable switch in conjunction with the gating functions 120-130 to control whether the disable latches 106-116 can activate functionality in the blocks 132-142. Although the blocks 132-142 are depicted within the functional macro 104, any number of the blocks 132-142 can be located elsewhere within the functional unit 102 or processor 100. Each of the disable latches 106-116 may independently control enable/disable state values of functionality in the blocks 132-142 when the DAL 118 is enabled. Conversely, when the DAL 118 is disabled, the state values of the disable latches 106-116 is irrelevant, as the disable latches 106-116 cannot affect functionality of the blocks 132-142 under such a condition. Although the disable latches 106-116, gating functions 120-130, and blocks 132-142 are depicted in a one-to-one relationship in FIG. 1, the scope of the invention is not so limited. To the contrary, the disable latches 106-116, gating functions 120-130, and blocks 132-142 can be combined in various combinations, such as a single disable latch affecting functionality in multiple blocks. Additionally, any number of disable latches, DALs, gating functions, and affected blocks are included within embodiments of the present invention.

Figure 2:
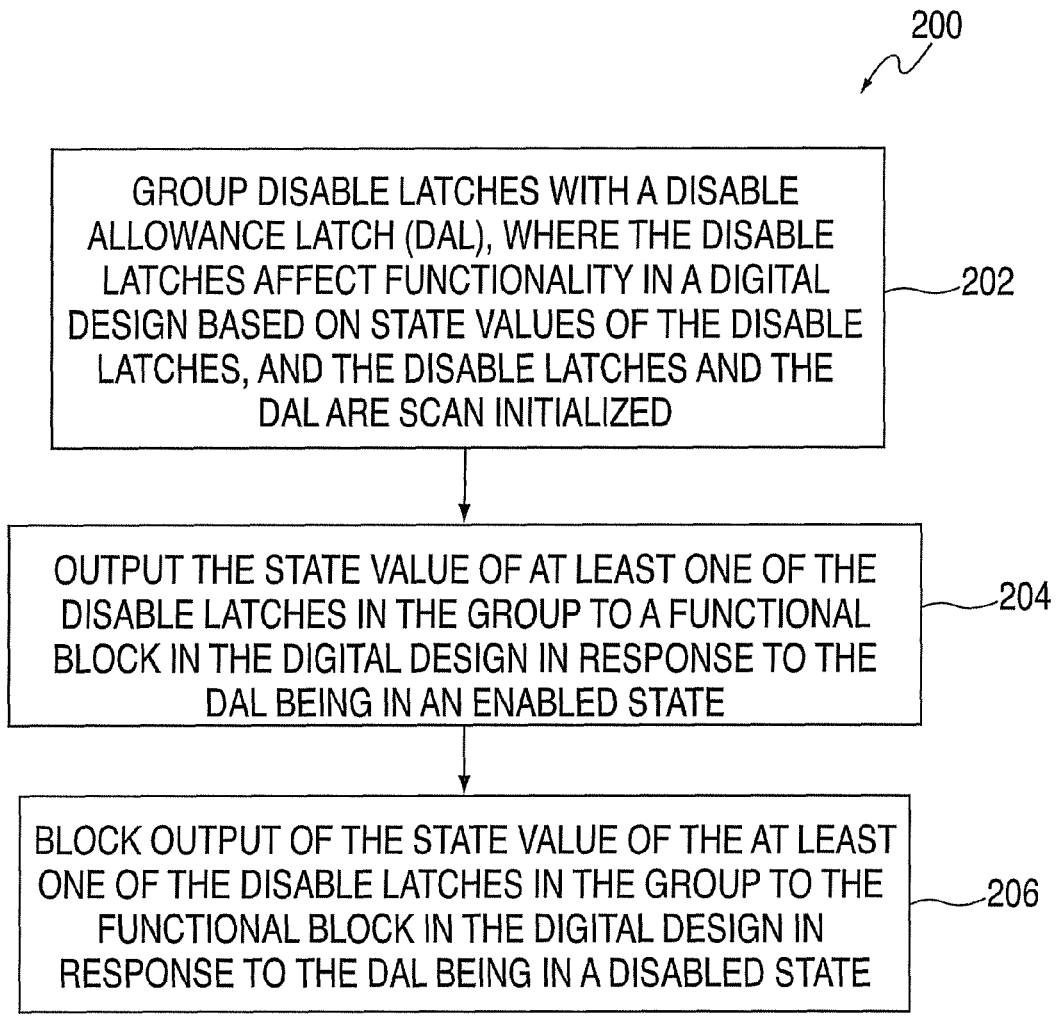
FIG. 2 depicts an exemplary process for enhancing reliability on scan-initialized latches that affect functionality in a digital design in accordance with an exemplary embodiment.

Turning now to FIG. 2, a process 200 for enhancing reliability on scan-initialized latches that affect functionality in a digital design will now be described in reference to the processor 100 of FIG. 1 and in accordance with exemplary embodiments. At block 202, disable latches 106-116 are grouped with DAL 118 in functional macro 104. The disable latches 106-116 affect functionality in blocks 132-142 of the processor 100 based on state values of the disable latches 106-116. The disable latches 106-116 and the DAL 118 are scan initialized to establish default values prior to running the processor 100 in a normal mode of operation. When the processor 100 runs in the normal mode of operation, software executing within the processor 100 cannot modify state values stored in the disable latches 106-116 or the DAL 118. Thus, the functionality in the blocks 132-142 is enabled/disabled at initialization.

At block 204, the state value of at least one of the disable latches 106-116 grouped in the functional macro 104 is output to one or more of the blocks 132-142 in the processor 100 in response to the DAL 118 being in an enabled state. The gating functions 120-130 provide logic for determining whether to output the state values of the disable latches 106-116. For example, when the DAL 118 is in the enabled state, the gating functions 120-130 allow the state values of the disable latches 106-116 to affect functionality in the blocks 132-142. If the DAL 118 is enabled and disable latch 106 is enabled/active, then gating function 120 outputs the enabled/active state to block 132, which affects functionality associated with block 132.

At block 206, the gating functions 120-130 block output of the state value of the disable latches 106-116 in the functional macro 104 to the blocks 132-142 in the processor 100 in response to the DAL 118 being in a disabled state. For example, if the DAL 118 is disabled and disable latch 106 is enabled/active, then gating function 120 blocks the enabled/active state to block 132, preventing functionality effects associated with block 132. Similarly, if DAL 118 is enabled and disable latch 106 is disabled/inactive, then gating function 120 outputs the disabled/inactive state to block 132, preventing functionality effects associated with block 132. Thus, the gating functions 120-130 can act as logical AND-gate functions, such that functionality effects to the underlying blocks 132-142 are only allowed when both the DAL 118 and the corresponding disable latches 106-116 are enabled. Any other combination of the state values for the DAL 118 and the disable latches 106-116 results in sending a disable/inactive signal to the associated underlying blocks 132-142, which is equivalent to output blocking. In an alternate exemplary embodiment, the gating functions 120-130 are buffers, such as tri-state buffers. The gating functions 120-130 can incorporate any variety of technologies that produce the same end result.

While the process 200 is described in reference to the processor 100 of FIG. 1, it will be understood that the process 200 can be applied to any digital design that incorporates scan-initialized latches to enable/disable functionality during a scan/initialization mode. For example, process 200 can be applied to other digital designs, such as an application specific integrated circuit (ASIC), a programmable logic device (PLD), or other such digital devices. Therefore, the processor 100 of FIG. 1 can represent a variety of digital designs that incorporate scan-initiated latches to disable/enable functional blocks.

Technical effects and benefits include enhancing reliability on scan-initialized latches that affect functionality in a digital design. By using an additional scan-initialized latch (DAL) to enable/disable a group of scan-initialized latches functioning as disable or mode latches, overall susceptibility of a digital design to unexpected enabling of a scan-initialized latch can be reduced. Should an SEU, such as an alpha particle, strike one of the disable latches causing it to change to enabled/active mode, the functionality associated with the modified disable latch can remain disabled unless the DAL is also enabled. Should an SEU affect the DAL, the design functionality can still remain disabled based on the state of the disable latches. Grouping a DAL with multiple disable latches can provide additional advantages of lowering cost and complexity as compared to assigning one DAL per disable latch. Further benefits include mitigating the effects of SEU events without actively monitoring or reacting to the events during normal processing, which may result in less reliance on error detection, handling or recovery logic in a digital design, such as a high reliability processor.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguish one element from another.

The invention claimed is:

1. A system for enhancing reliability on scan-initialized latches that affect functionality in a digital design, the system comprising:
   a group of latches that affect functionality in the digital design based on state values of the latches, wherein the latches are scan initialized;
   a disable allowance latch (DAL) allocated to the group of latches, wherein the DAL is a scan-initialized latch; and
   a gating function outputting the state value of at least one of the latches in the group to a functional block in the digital design in response to the DAL being in an enabled state and blocking the gating function output in response to the DAL being in a disabled state.

2. The system of claim 1 further comprising:
   a plurality of the gating functions interfaced to a plurality of functional blocks in the digital design, wherein each of the gating functions is associated with one of the latches in the group, the DAL, and one of the functional blocks.

3. The system of claim 2 wherein the group of latches, the DAL, and the plurality of gating functions in combination decreases susceptibility to single event upsets (SEUs) that affect functionality in the digital design relative to the group of latches alone.

4. The system of claim 1 wherein the gating function is an AND-gate function.

5. The system of claim 1 wherein the gating function is a buffer.

6. The system of claim 1 wherein the group of latches includes one or more of a disable latch or a mode latch.

7. The system of claim 1 wherein the digital design is one of: a processor, an application specific integrated circuit (ASIC), and a programmable logic device (PLD).

8. A method for enhancing reliability on scan-initialized latches that affect functionality in a digital design, the method comprising:
   grouping latches with a disable allowance latch (DAL), wherein the latches affect functionality in the digital design based on state values of the latches, and further wherein the latches and the DAL are scan initialized;
   outputting the state value of at least one of the latches in the group to a functional block in the digital design in response to the DAL being in an enabled state; and
   blocking output of the state value of the at least one of the latches in the group to the functional block in the digital design in response to the DAL being in a disabled state.

9. The method of claim 8 wherein the outputting and blocking are performed using a gating function.

10. The method of claim 9 wherein the gating function is an AND-gate function.

11. The method of claim 9 wherein the gating function is a buffer.

12. The method of claim 8 wherein the group of latches includes one or more of a disable latch or a mode latch.

13. The method of claim 8 wherein the digital design is one of: a processor, an application specific integrated circuit (ASIC), and a programmable logic device (PLD).

14. An apparatus for enhancing reliability on scan-initialized latches that affect functionality in a digital design, the apparatus comprising:
   a group of disable latches in a functional macro of the digital design that affect functionality in the functional macro based on state values of the disable latches, wherein the disable latches are scan initialized;
   a disable allowance latch (DAL) allocated to the group of disable latches, wherein the DAL is a scan-initialized latch; and
   a gating function outputting the state value of at least one of the disable latches in the group to one or more functional blocks in the digital design in response to the DAL being in an enabled state and blocking the gating function output in response to the DAL being in a disabled state.

15. The apparatus of claim 14 further comprising:
   a plurality of the gating functions interfaced to a plurality of functional blocks in the digital design, wherein each of the gating functions is associated with one of the disable latches in the group, the DAL, and one or more of the functional blocks.

16. The apparatus of claim 15 wherein the group of disable latches, the DAL, and the plurality of gating functions in combination decreases susceptibility to single event upsets (SEUs) that affect functionality in the digital design relative to the group of disable latches alone.

17. The apparatus of claim 14 wherein the gating function is an AND-gate function.

18. The apparatus of claim 14 wherein the gating function is a buffer.

19. The apparatus of claim 14 wherein one or more of the disable latches functions as a mode latch to configure and enable testing of the digital design.

20. The apparatus of claim 14 wherein the digital design is one of: a processor, an application specific integrated circuit (ASIC), and a programmable logic device (PLD).

* * * * *